United States Patent [19]
McKleroy

[11] Patent Number: 5,574,313
[45] Date of Patent: Nov. 12, 1996

[54] HERMETICALLY SEALED MICROWAVE INTEGRATED CIRCUIT PACKAGE WITH GROUND PLANE FUSED TO PACKAGE FRAME

[75] Inventor: Christopher C. McKleroy, Los Altos, Calif.

[73] Assignee: Litten Systems, Inc., San Jose, Calif.

[21] Appl. No.: 324,473

[22] Filed: Oct. 17, 1994

[51] Int. Cl.$^6$ .......................... H01L 29/40; H01L 23/06; H01P 3/08
[52] U.S. Cl. .......................... 257/728; 257/664; 257/729; 333/238
[58] Field of Search .................................. 257/728, 664, 257/710, 723, 729; 333/238, 246, 247

[56] References Cited
U.S. PATENT DOCUMENTS
5,109,594  5/1992  Sharp et al. .......................... 257/693

Primary Examiner—Sara W. Crane
Assistant Examiner—Jhihan Clark
Attorney, Agent, or Firm—Clifton L. Anderson

[57] ABSTRACT

A hermetically sealed microwave integrated circuit (MIC) includes a motherboard with a ground plane of aluminum-silicon alloy, a plastic/ceramic composite dielectric layer, and a copper-nickel-gold upper layer. The alloy for the ground plane is selected to allow fusion with aluminum containing less than 1% silicon to create a hermetic seal. The ground plane is fashioned to beyond the interior and upper layers, forming a welding flange that circumscribes the perimeters of the interior and upper layers. Recesses are cut into the dielectric to expose the ground plane. Active devices and microwave integrated circuits (MICs) are disposed within the recesses and mounted on the ground plane. The metallized upper layer is etched and patterned to create a microwave integrated circuit. The alloy flange is laser-welded to the annular lower surface of a frame made of aluminum containing less than 1% silicon, so that the interior plastic layer, the metallized upper layer, and all active devices are within the frame. A cover is made from an aluminum-silicon alloy that is selected to fuse with aluminum containing less than 1% silicon, so as to form a hermetic seal. The cover is laser welded to the upper annular surface of the frame. When both the flange and the cover are fused with the frame, the active devices are hermetically sealed within the frame.

6 Claims, 5 Drawing Sheets

HERMETICALLY SEALED MICROWAVE INTEGRATED CIRCUIT PACKAGE WITH GROUND PLANE FUSED TO PACKAGE FRAME

BACKGROUND OF THE INVENTION

The present invention relates to microwave integrated circuits, and, more particularly, to microwave integrated circuit package systems. A major objective is to provide a relatively economical, compact, hermetically sealed microwave integrated circuit.

The mass and volume of microwave navigational systems used by aircraft and spacecraft must be minimized. Of the various microwave technologies available, microwave integrated circuit systems require the least mass and volume. A typical microwave integrated circuit includes a microstrip motherboard with active devices mounted on a grounded section thereon. The active devices can include discrete transistors and monolithic microwave integrated circuits (MMICs). A typical MMIC is an integrated circuit fabricated on a gallium arsenide substrate to enhance high frequency operation.

The active components require protection from ambient moisture and other corrosives. Hermetic seals are typically required to achieve the desired protection over the large temperature ranges to which airborne and spaceborne vehicles are subject. Hermetic seals are fused metal-metal, glass-glass, or glass-metal bonds.

While active components can be hermetically sealed individually, a smaller overall package can be achieved by hermetically sealing the entire microwave integrated circuit (MIC) assembly. Typically, a set of MICs are inserted into a metal tub. A cover is then welded onto the tub to effect the hermetic seal.

Tubs have been fabricated of various metals, including stainless steel, Kovar (an alloy of cobalt, iron, and nickel), and aluminum. In the cases of stainless steel and Kovar, the top can be of the same material as the tub. The problem with Kovar and stainless steel is that the materials are relatively heavy and expensive. Aluminum is lighter and more economical. However, components consisting of the most common form of aluminum, the relatively hard industry standard 6061, cannot be welded without danger of cracking. Soft aluminums can be welded to each other, but are not strong enough to provide durable precision machined features such as screw threads. The solution has been to weld a soft aluminum cover to a hard aluminum tub.

A microstrip motherboard typically requires a conductor pattern fabricated on the top of a dielectric substrate. A ground plane is generally required on the bottom of the substrate. However, in some cases, the base of the tub can serve as the ground plane. This latter approach results in a lower profile package. On the other hand, an integral ground plane (e.g., of hard aluminum) provides structural reinforcement for the dielectric, reducing the chances of motherboard breakage. The integral ground plane thus simplifies handling and reduces fabrication costs. The disadvantage is that the resulting package has a higher profile.

Many MIC motherboards use ceramic (e.g., $Al_2O_3$ 99.6%) as the dielectric material. The thermal coefficient of expansion of ceramic is much lower than for aluminum. Hence, bonding of the ground plane to the ceramic or the ceramic to the tub base is problematic due to differential stresses introduced during temperature swings. Compliant epoxies have become available to reduce the stresses, but the danger of delamination remains.

Recently, temperature-stable dielectric composites of ceramic and polymer have been developed to replace ceramic substrates for MIC purposes. Because they are a brittle thermoset polymer, they lend themselves to thermocompression (or thermosonic) wire bonding. These composites, such as TMM (Temperature-Stable Microwave Material), a brittle thermoset plastic product of Rogers Corporation of Rogers, Conn., have thermal coefficients of expansion that are much closer to aluminum. Hence, problems with delamination are reduced. These materials are relatively inexpensive and more easily fabricated. Ceramic must be sintered, whereas the ceramic/polymer composites and PTFE woven glass can be molded. Once formed, the ceramic/polymer substrates are more easily machined, e.g., by end milling. Furthermore, the ceramic/polymer composites are lighter than the ceramics.

While these several approaches to forming hermetically sealed microwave integrated circuits have been successful, they have generally resulted in packages that are larger, heavier, and more expensive than desired. What is needed is a smaller, lighter, and economical hermetically sealed microwave integrated circuit package.

SUMMARY OF THE INVENTION

In accordance with the present invention, a hermetically sealed microwave integrated circuit package includes a microwave integrated circuit motherboard, active devices mounted on a dielectric layer of the mother board, a hard aluminum frame which has a soft aluminum ground plane of the motherboard fused or welded to it, and a cover welded to the frame. The annular frame circumscribes the active devices and accommodates feed-through interconnects. The ground plane seals the frame from below while the cover seals from above to complete the hermetic seal. This structure can be fabricated by forming the motherboard, mounting and connecting active devices, welding the motherboard ground to the plane frame, and welding the cover to the frame.

The motherboard can include a polymer/ceramic composite dielectric layer sandwiched between a microstrip conductor pattern and a ground plane. The ground plane extends beyond the perimeter of the dielectric substrate to define a flange. It is this flange that is fused to the frame. The soft aluminum preferably includes at least 6% silicon, while the hard aluminum includes at most 1% silicon. Specifically, the hard aluminum can be aluminum 6061-T6 and the soft aluminum can be 4047.

The dual use of the motherboard ground plane as the base of the hermetically sealed package yields a compact low-profile package. The materials are relatively light and low cost. The integral ground plane simplifies handling of the motherboard, further reducing costs. Furthermore, manufacturing tolerances are relatively generous, again simplifying fabrication and reducing costs. These and other features and advantages of the invention are apparent from the description below with reference to the following drawings.

DESCRIPTION OF THE PREFERRED EMBODIMENTS

Figure 1:
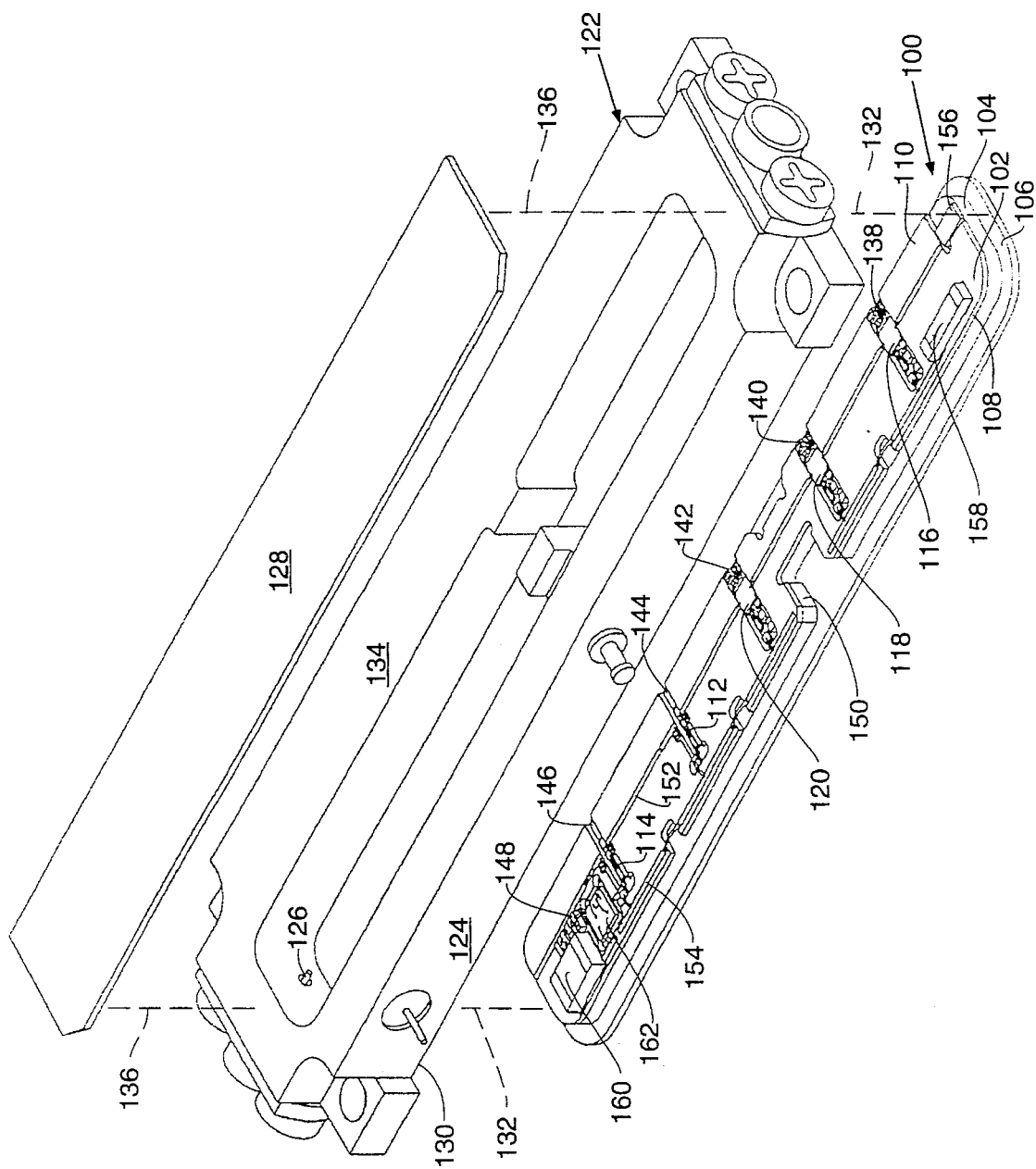
FIG. 1 is a diagram of a microwave package in accordance with the present invention, before the ground plane, frame, and top are welded together.

In accordance with the present invention, a microwave integrated circuit 1 package comprises the following: a microwave integrated circuit (MIC) motherboard 102 having a ground plane 104 of relatively soft aluminum-silicon alloy with a welding flange 106, a polymer/ceramic composite dielectric layer 108 suitable for microwave transmission, and top metallized layers 110; active devices such as field-effect transistors (FETs) 112 and 114, MMICs 116, 118, and 120; a frame 122, made of relatively hard aluminum, that serves as walls 124 of the package and accommodates a microwave feedthrough interconnect 126; and a cover 128 made from relatively soft aluminum-silicon alloy, as shown in FIG. 1. When assembled, welding flange 106 of ground plane 104 is laser welded to a lower surface 130 of frame 122, as schematically indicated by dashed lines 132, and cover 128 is laser welded to the upper surface 134 of frame 118, as schematically indicated by dashed lines 136, as seen in FIG. 1. The housing is shown unwelded in FIG. 1 to illustrate interior components and mating geometries.

Figure 2:
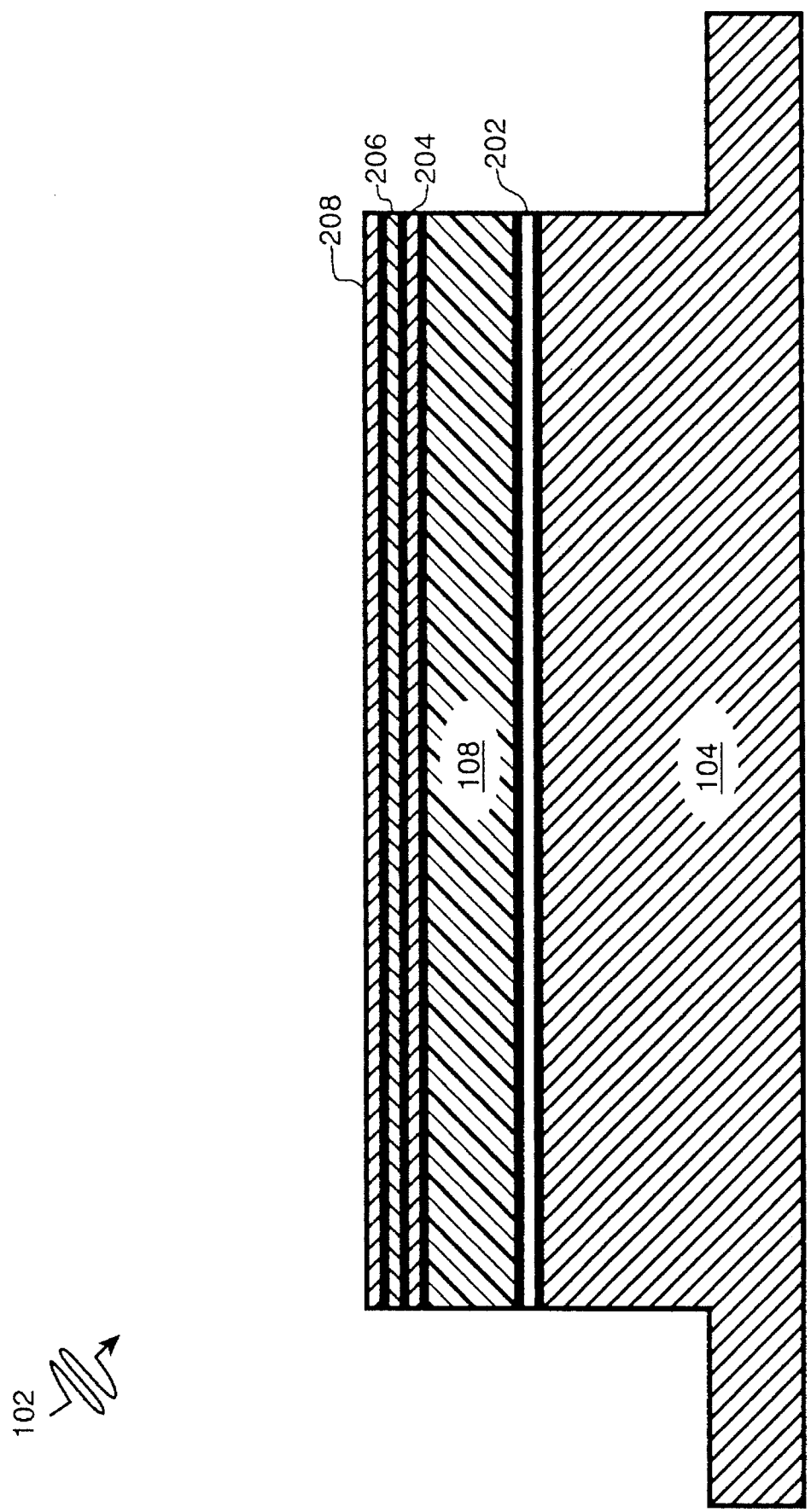
FIG. 2 is a vertical cross-section of a motherboard in accordance with the present invention.

Motherboard 102 is schematically shown in cross-section in FIG. 2. A sheet 104 of aluminum 4047 is laminated to a lower surface of dielectric layer 108, using a resin adhesive 202 of the same dielectric as dielectric layer 108, to form a ground plane. Adhesive 202 forms a layer about 1 mil thick. Composite layer 108 is preferably TMM, or another microwave-compatible substrate. In TMM, the ceramic is homogeneously distributed throughout the plastic. For microstrip applications, a dielectric layer with a homogeneous dielectric constant in the range of 4 to 10 and a low loss tangent, such as TMM, is preferred. In addition, it is desirable to match the coefficient of expansion of aluminum, as does TMM, in order to prevent damage caused by thermal stresses. Dielectric layer 108 is preferably 15 mils thick to reduce dielectric loss. Recesses 138, 140, 142, 144, 146, and 148, seen in FIG. 1, are end-milled into dielectric layer 108 to accommodate active and passive devices. Active devices are herein defined as devices that deliver power (i.e., small signal gain) to other elements of a circuit.

Ground plane 104 is composed of industry-standard aluminum 4047, which is an aluminum-silicon alloy of about 11.7% silicon and about 88.3% aluminum. Any aluminum-silicon alloy of at least 80% aluminum and at least 6% silicon can be used so long as the alloy can be fused to an aluminum-based material of at least 90% aluminum and no more than 1% silicon. In the industry-standard Brinell scale of hardness, the alloy preferably has a hardness between 50 and 60. Ground plane 104 is machined, e.g., by end milling, to form a support mesa 150 underlying dielectric layer 108 and cut away at the circumference to create welding flange 106, as shown in FIGS. 1 and 2. Flange 106 is roughly 20 mils thick, while at its thickest, base 104 is roughly 60 mils thick. Thus, the differential thickness of support mesa 150 is about 40 mils, as shown in FIG. 2. The width of flange 106 (the distance from the edge of dielectric layer 108 to the outer edge of the alloy) is 45 mils.

An upper surface of dielectric layer 108 has copper cladding 204 of about 700 microinches thickness, as schematically illustrated in FIG. 2. Atop the copper is a nickel plate 206 of 20 to 50 microinches, as schematically illustrated in FIG. 2. A thin gold plate 208 of 100–200 microinches goes on top of the nickel as schematically illustrated in FIG. 2

Motherboard 102 also includes a microwave trace 152 and a DC trace 154, as seen in FIG. 1. Active devices such as discrete field-transistors 112 and 114 and monolithic microwave integrated circuits (MMICs) 116, 118, and 120 are attached to the ground plane within end milled sections of the motherboard to provide thermal sinking. Passive devices, such as capacitors 158 and 160 can be mounted directly on dielectric 108 since they have less need for thermal sinking. Microwave trace 152 guides microwaves to MMICs and FETs, and DC trace 154 distributes DC current to active devices that require a bias current. The set of passive devices further include an attenuator 156, and capacitors 158 and 160. A voltage regulator 162 regulates the voltage. The completed microwave integrated circuit is a 16 GHz high gain monolithic MIC (MMIC) assembly, tuned for microwave performance.

Flange 106 extends around the entire perimeter of dielectric layer 108, completely circumscribing layer 108 and all active devices, microwave integrated circuits including active devices, and passive devices of motherboard 102, as illustrated in FIG. 1.

Figure 3:
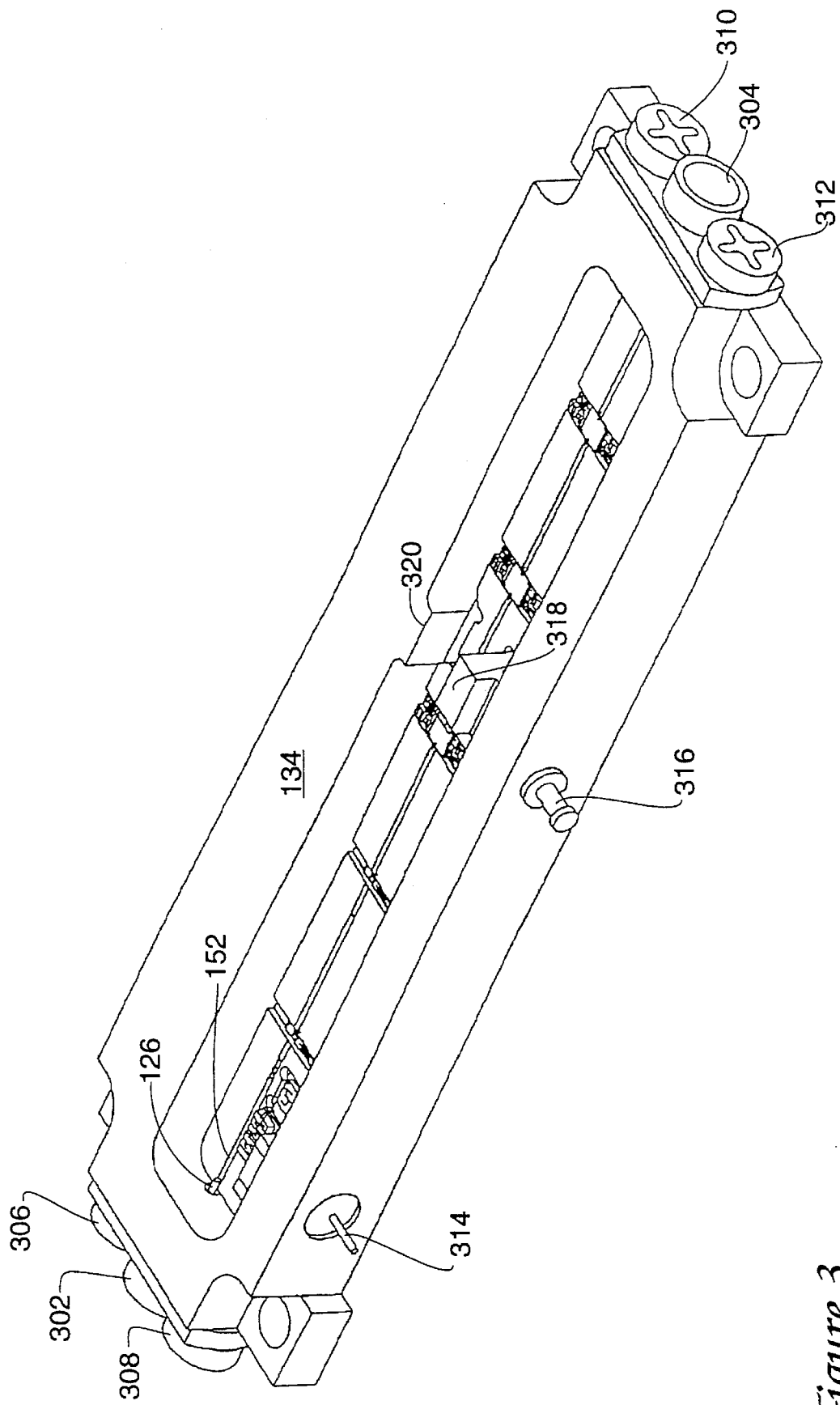
FIG. 3 is a schematic view of the package of FIG. 1, after the welding flange is welded to the frame, but before the top is welded to the frame.
Figure 4:
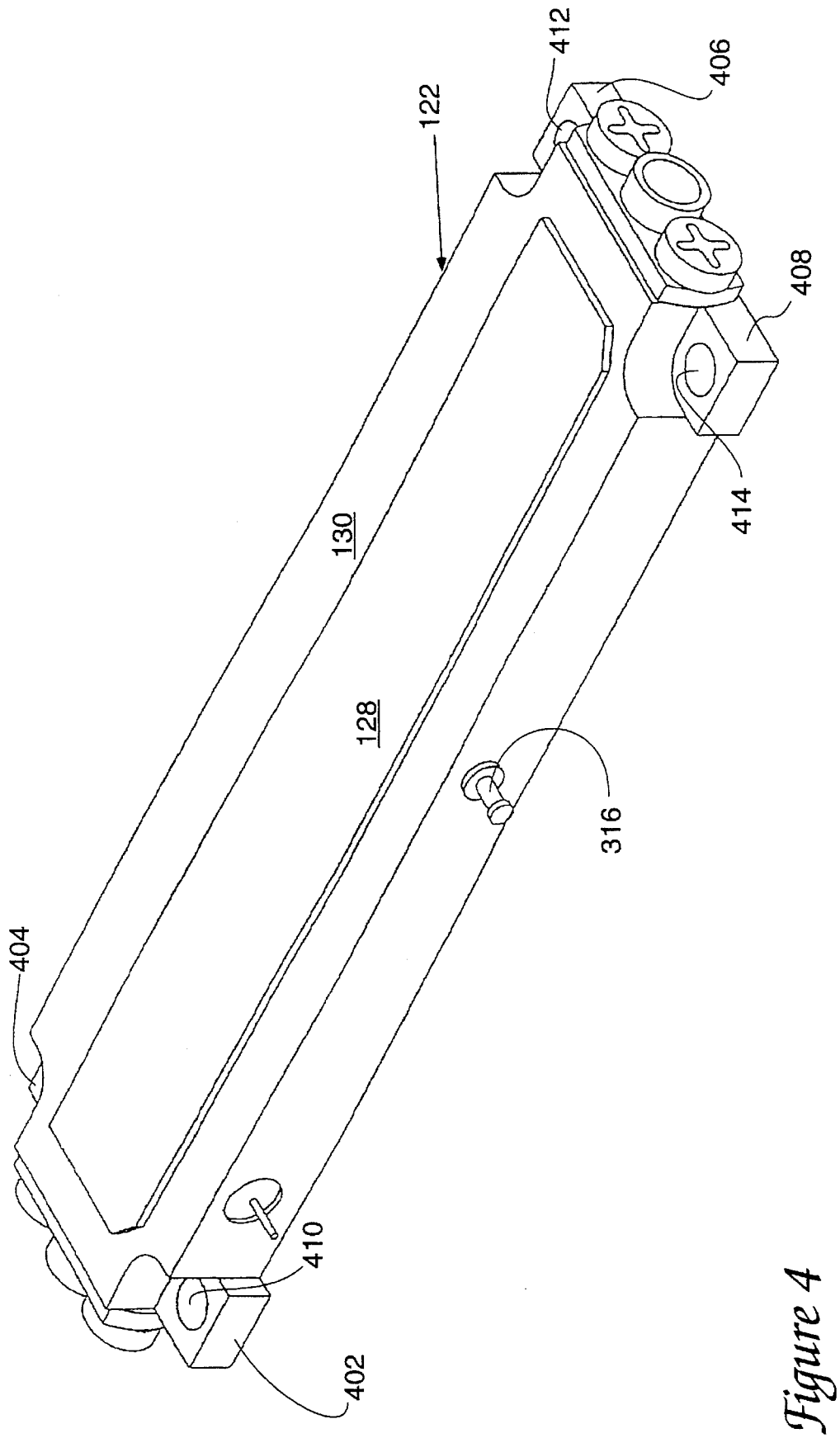
FIG. 4 is a schematic view of a completed microwave integrated circuit package in accordance with the present invention.

Frame 122, shown in FIGS. 1, 3 and 4, is an annular frame made from aluminum 6061-T6, or other relatively hard (typically Brinell 80) aluminum-based material with an aluminum content of over 90% and a silicon content of less than 1%. The T6 involves a chemical treatment plus thermal annealing to harden the aluminum. The outer dimensions of frame 122 are about 2.8"×0.69"×0.2". The inner dimensions of frame 122 are about 2.47"×0.3"×0.17". The frame defines the walls 124 of package 100. Walls 124 accommodate a microwave feedthrough interconnect 126, as shown in FIG. 1. Another microwave feedthrough interconnect is on the opposite wall, not shown in these drawings.

Welding flange 106 is laser-welded to frame 122 to create a hermetic seal, resulting in an open tub-shaped housing, as shown in FIG. 3. When the ground plane and frame are welded together, a coaxial pin (not shown) through microwave feedthrough interconnect 126 is bonded to microwave trace 152, as indicated in FIG. 3. Microwave feedthrough interconnect 126 leads to a connector shroud 302, as seen in FIG. 3. Connector shroud 302 and a pin (not shown) connect this package with other systems. Opposing connector shroud 304 is located at the opposite end of frame 122. Connector shrouds 302 and 304 are mounted to frame 122 by respective pairs of connector mounting screws 306, 308 and 310, 312, as seen in FIG. 3.

Frame 122 also includes a DC bias terminal 314, as seen in FIG. 3. This terminal supplies a DC voltage via DC trace 154 to active devices that require a bias current. A ground terminal 316, shown in FIG. 3, grounds the microwave integrated circuit. Waveguide cutoffs 318 and 320 channel microwaves, preventing them from passing freely thorough and thus preventing oscillation. Coaxial grounding is obtained through feedthrough interconnect 126, peripheral to RF glass (not shown) and air dielectric in the coaxial section. If necessary, a dovetail groove can be added under feedthrough interconnect 126 on the weld cavity surface to accept a resilient, conductive plastic or metal grounding material.

Cover 128 is of aluminum 4047 or a similar relatively soft, aluminum-silicon alloy of at least 80% aluminum and 6% silicon. Cover 128 is laser welded to upper surface 134 frame 122. When motherboard, frame, and cover 128 are laser welded together, the contents are hermetically sealed in package 100, as shown in FIG. 4. Mounting bosses 402, 404, 406, and 408 include apertures 410, 412, and 414 (the aperture of boss 404 is not visible). Bolts or screws through the apertures are used to mount hermetically sealed package 100 onto a plate or into a chassis. Package 100 is electrically connected to other systems via connector shrouds 302 and 304 and DC bias terminal 314, as shown in FIGS. 3 and 4.

Figure 5:
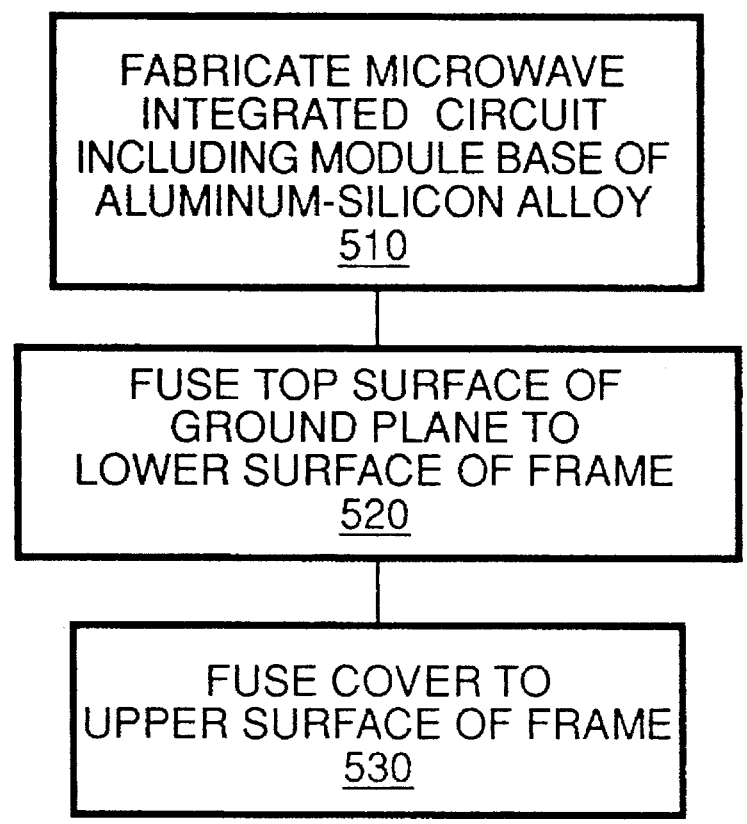
FIG. 5 is a flow chart of a method of the present invention.

A method 500 in accordance with the present invention comprises the following steps, as shown in FIG. 5. A microwave integrated circuit is fabricated, at a step 510. The microwave integrated circuit includes a ground plane of an aluminum alloy containing at least 80% aluminum and at least 6% silicon, such as industry-standard aluminum 4047.

The microwave integrated circuit includes a polymer/ceramic composite dielectric substrate layer suitable for microwave transmission. TMM, a product of Rogers Corp. can be used. The substrate layer is backed by a sheet of silicon-doped aluminum, such that the silicon content of the aluminum alloy is at least 6% and preferably 11.7%, as in aluminum 4047. A metal layer, as of thin-film copper-nickel-gold, is disposed on the upper surface of the substrate layer. The motherboard is machined so that cavities (exposing the ground plane) are created for receiving active and passive devices. A flange of exposed 4047 aluminum circumscribes the plastic and microstrip layers. The metal layer is then patterned, and the motherboard is populated with active and passive devices with wire bonded interconnects.

The flange of the aluminum alloy base of the microwave integrated circuit is laser welded to the lower surface of an annular frame, at a step 520. The frame is annular and is made from aluminum 6061-T6, or other relatively hard (typically Brinell 80) aluminum-based material with an aluminum content of over 90% and a silicon content of less than 1%. The frame can be machined to suit the microwave integrated circuit dimensions. The frame serves as the walls of the microwave integrated circuit and provides feedthrough microwave interconnects. The laser welding creates a hermetic seal between the ground plane and the frame. After welding, the active devices are within the frame, although the frame is as yet open on top.

A cover of 4047 aluminum, or other aluminum alloy with an aluminum content of at least 80% and a silicon content of at least 6%, is laser welded to the upper surface of the ring-frame, at a step 530. When the base and the cover are both laser-welded to the frame, the MICs and their active devices are hermetically sealed inside the frame.

Because the microwave integrated circuit can be populated before it is inserted into the frame, manufacture is simplified as there is no need for deep access die attach or wire bonding. In case of breakage, malfunction, or design change, the microwave integrated circuit can be removed with an end mill. The microwave integrated circuit can then be repaired or another motherboard substituted, and both microwave integrated circuit and frame can be reused.

Ground plane 104 is lap welded to frame 122. Lap welding provides relaxed manufacturing tolerances. Furthermore, lap welds are amenable to end milling to permit reuse of the motherboard. Alternatively, ground plane 104 can be butt welded to frame 122. The aluminum and substrate layers can be machined to create the welding flange before or after the microwave integrated circuit is populated with MMICs and other devices. While the preferred dielectric is a polymer/ceramic composite, other dielectric materials can be used. For example, a glass fiber reinforced polymer, such as Duroid (a product of Rogers Corporation of Rogers, Conn.) can be used as the dielectric. These and other modifications to and variations upon the described embodiments are provided for by the present invention, the scope of which is limited only by the following claims.

What is claimed is:

1. A microwave integrated circuit package comprising:

a microwave-integrated circuit motherboard including a dielectric layer suitable for microwave transmission, an upper layer including a microstrip conductor pattern disposed on one surface of said motherboard, and a ground plane that consists of relatively soft aluminum alloy of at least 80% aluminum and at least 6% silicon and defines a flange that extends radially beyond and circumscribes said dielectric layer disposed on the other surface of said motherboard;

at least one active device disposed on said motherboard;

a frame of relatively hard aluminum alloy consisting of at least 90% aluminum and no more than 1% silicon, said frame having an upper surface and a lower surface, said lower surface being fused to said flange so that said microstrip conductor pattern and said active devices of said motherboard fit within said frame; and a cover fused to said upper surface of said frame so that said ground plane, frame, and cover hermetically enclose said active devices.

2. A microwave integrated circuit package as recited in claim 1 wherein said relatively hard aluminum alloy is 6061-T6 aluminum and said relatively soft aluminum alloy is 4047 aluminum.

3. A microwave integrated circuit package as recited in claim 1 wherein said dielectric layer is a composite of polymer and ceramic.

4. A microwave integrated circuit package as recited in claim 1 wherein said dielectric layer is a glass fiber reinforced ceramic.

5. A package as recited in claim 1 wherein said relatively soft aluminum alloy has a Brinell number of no more than 60.

6. A package as recited-in claim 1 wherein said relatively hard aluminum alloy has a Brinell number of no less than 80.

\* \* \* \* \*